United States Patent [19]

Hayakawa et al.

[11] Patent Number: 5,375,710
[45] Date of Patent: Dec. 27, 1994

[54] IC CARRIER

[75] Inventors: Nanahiro Hayakawa; Satoshi Ohta, both of Tokyo, Japan

[73] Assignee: Yamaichi Electronics Co., Ltd., Tokyo, Japan

[21] Appl. No.: 159,139

[22] Filed: Nov. 30, 1993

[30] Foreign Application Priority Data

Dec. 1, 1992 [JP] Japan .................. 4-349711

[51] Int. Cl.⁵ .................. B65D 73/02; B65D 85/42
[52] U.S. Cl. .................................................. 206/331
[58] Field of Search ..................... 206/331, 328

[56] References Cited

U.S. PATENT DOCUMENTS

| | | |
|---|---|---|
| 3,652,974 | 3/1972 | Tems . |
| 4,765,471 | 8/1988 | Murphy .................. 206/331 X |
| 4,767,984 | 8/1988 | Bakker .................. 206/331 X |
| 4,881,639 | 11/1989 | Matsuoka et al. ............ 206/331 X |
| 5,026,303 | 6/1991 | Matsuoka et al. ............ 206/331 X |
| 5,080,228 | 1/1992 | Maston, III et al. ............ 206/331 |
| 5,291,994 | 3/1994 | Murphy .................. 206/331 |

*Primary Examiner*—William I. Price
*Attorney, Agent, or Firm*—Wenderoth, Lind & Ponack

[57] ABSTRACT

An IC carrier includes an IC receiving portion for receiving therein an IC package, and a latch arm for engaging an edge portion of the IC package received in the IC receiving portion so that the IC package may be anchored in the receiving portion. The IC carrier further includes a corner regulation portion formed on a foremost end portion of the latch arm and having a regulation element disposed along one side surface of a corner portion of an IC package body and a regulation element disposed along the other side surface thereof. The corner regulation portion is provided with an engagement claw for engaging an upper edge of the corner portion of the IC package body.

7 Claims, 7 Drawing Sheets

IC CARRIER

BACKGROUND OF THE INVENTION

1. Field of the Invention

This invention relates to an IC carrier used for carrying an IC package so as to be transferred, stored or connected to an IC socket or the like.

2. Prior Art

A conventional IC carrier as represented by the one disclosed, for example, in U.S. Pat. No. 3,652,974 is designed such that an engagement claw is brought into engagement with an upper edge of an IC package body received in an IC receiving portion, and a plurality of leads projecting sideward of the IC package are arranged to extend into corresponding slots formed in an upper surface of a carrier, and slot partition walls are disposed between adjacent leads.

However, this conventional IC carrier has the shortcoming that, if the lead pitches are comparatively large, the leads can easily be inserted into the corresponding slots, but if the lead pitches are very small, there is a possibility that the leads will climb over the slot partition walls and become deformed. Thus, this IC carrier is not suitable for the IC packages used in recent year in which the leads are arranged at very small pitches.

SUMMARY OF THE INVENTION

It is therefore an object of the invention to provide an IC package of a simple structure in which an IC package once placed on the IC carrier can be correctly positioned and securely held without inserting leads into corresponding slots and without providing positioning elements between adjacent leads as in the prior art.

In order to achieve the above object, there is provided an IC carrier comprising an IC receiving portion for receiving therein an IC package, and a latch arm for engaging an edge portion of the IC package received in the IC receiving portion so that the IC package may be anchored in the receiving portion. The IC carrier further comprising a corner regulation portion formed on a foremost end portion of the latch arm and having a regulation element disposed along one side surface of a corner portion of an IC package body and a regulation element disposed along the other side surface thereof. The corner regulation portion is provided with an engagement claw for engaging an upper edge of the corner portion of the IC package body.

According to this invention, the corner portions of the IC package body are received between the regulation elements of the corner regulation portions formed on the foremost end portions of the latch arms, and the side surfaces forming the corner portions are regulated by the regulation elements so that the IC package may be correctly positioned. At the same time, the engagement claws formed on the regulation portions are brought into engagement with the upper edges of the corner portions so that the IC package may be positively received in the receiving portion. Therefore, the IC package can be securely correctly positioned and the leads can be effectively prevented from being deflected, without depending on a means for inserting the leads into the slots and for disposing the positioning elements between adjacent leads as in the prior art.

DETAILED DESCRIPTION OF THE EMBODIMENTS

The embodiments of the present invention will be described with reference to the accompanying drawings.

Figure 1:
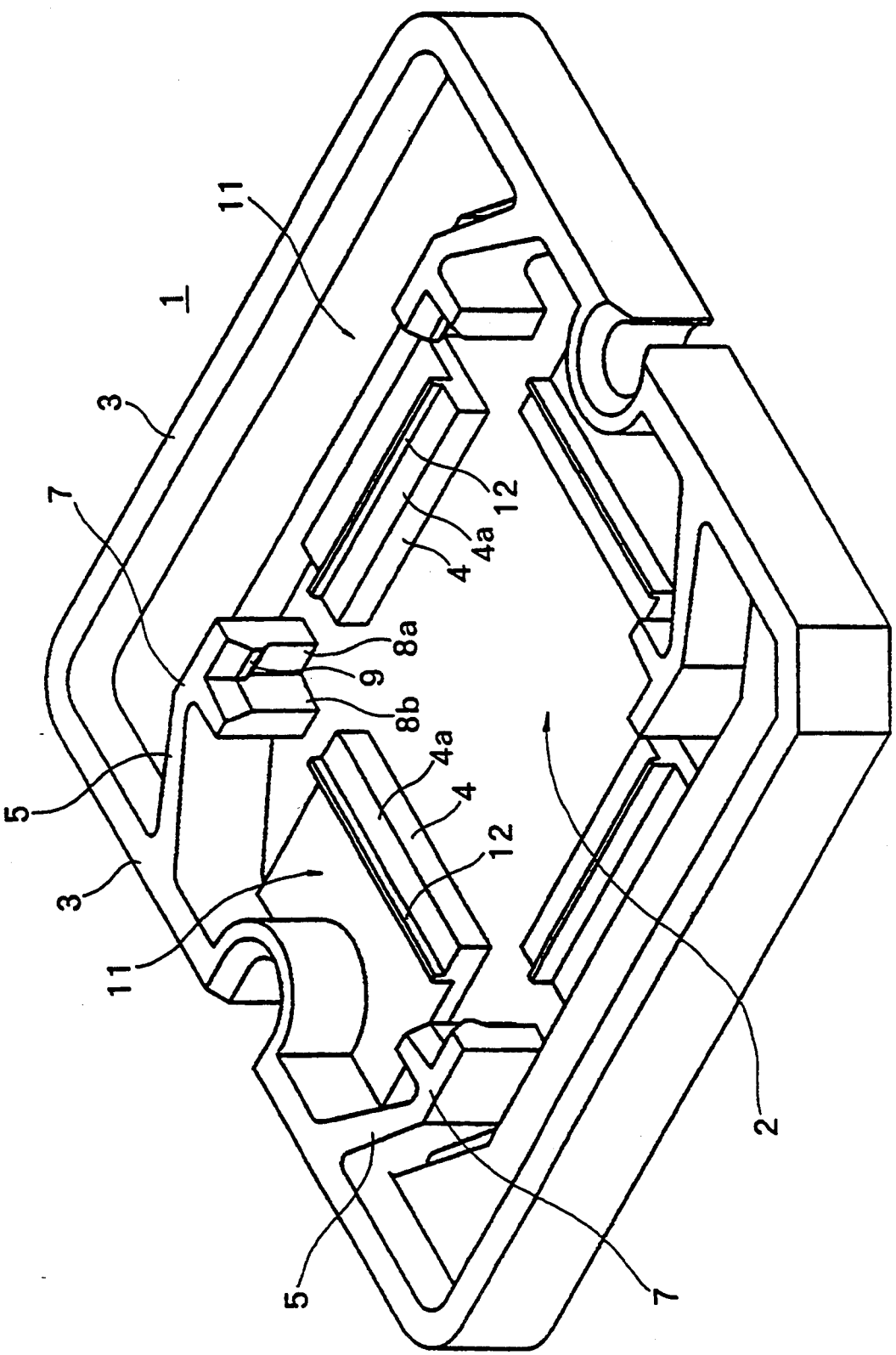
FIG. 1 is a perspective view of an IC carrier according to one embodiment of the present invention.
Figure 6:
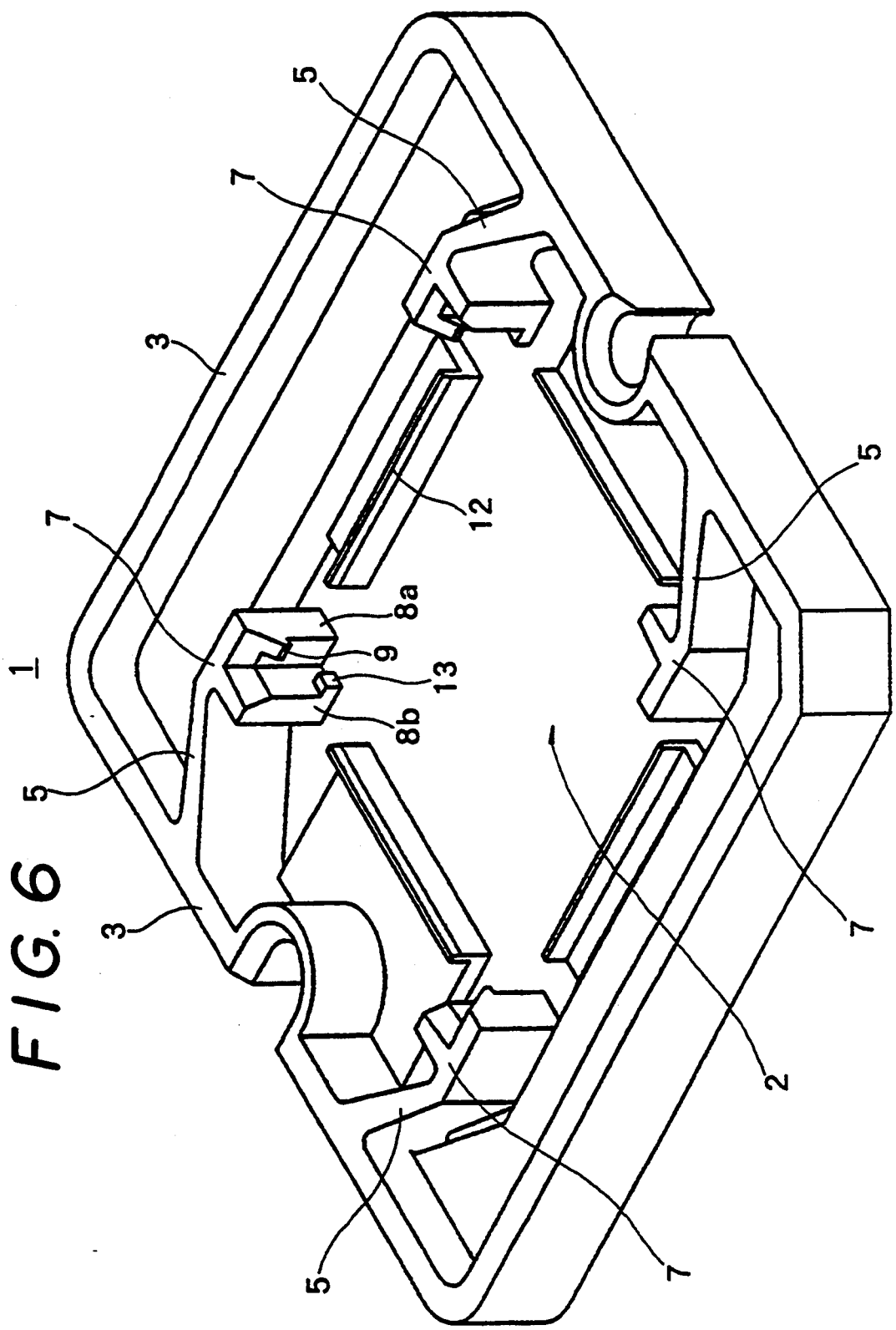
FIG. 6 is a perspective view of an IC carrier according to another embodiment of the present invention.

As typically shown in FIGS. 1 and 6, an IC carrier 1 has a generally rectangular outer configuration and includes an IC receiving portion 2 in a central area of an upper surface thereof. The IC carrier 1 further includes a frame 3 defining the IC receiving portion 1, IC support portions 4, and latch arms 5, all integrally formed using synthetic resin material.

Figure 4:
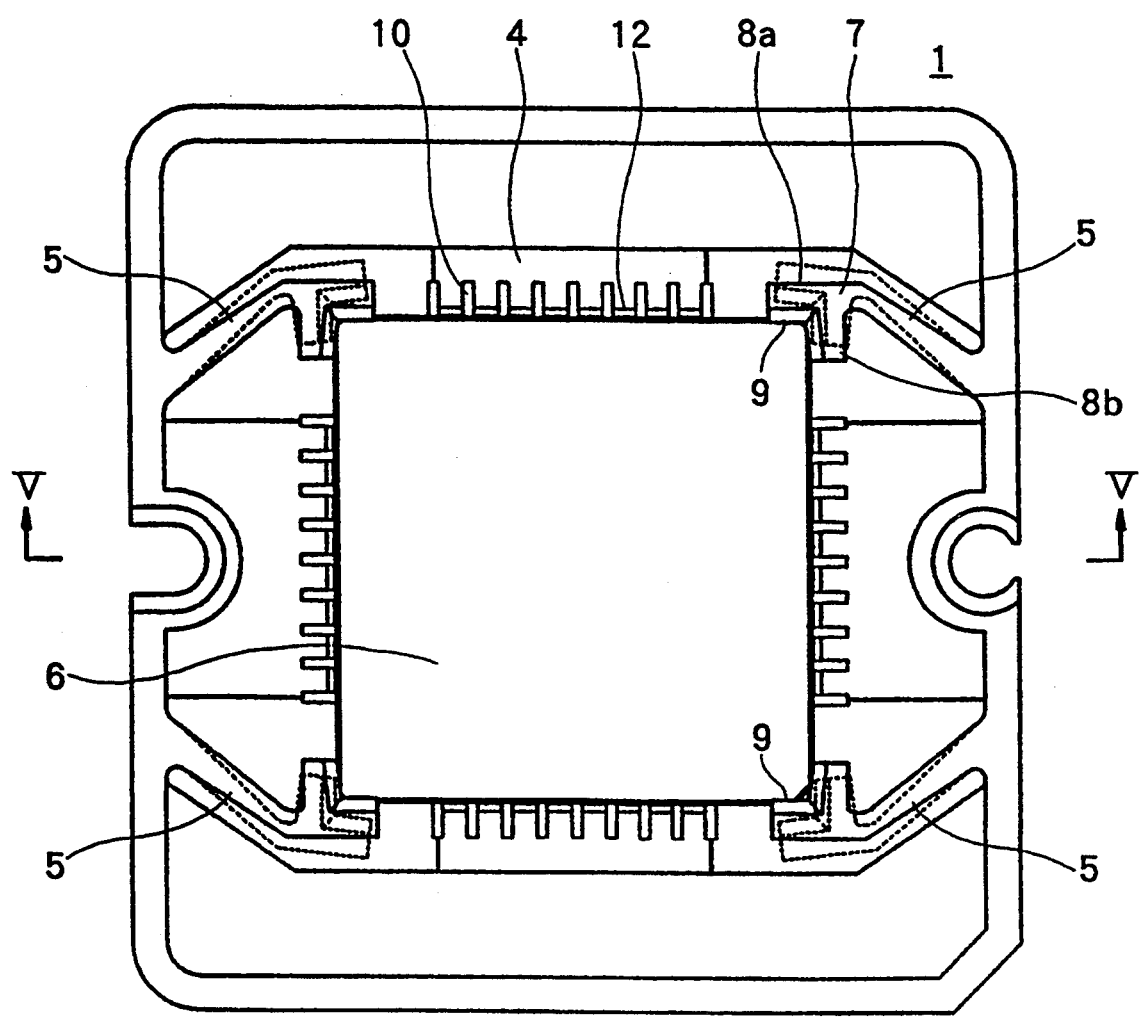
FIG. 4 is a plan view of an IC carrier with an IC package received therein.
Figure 5:
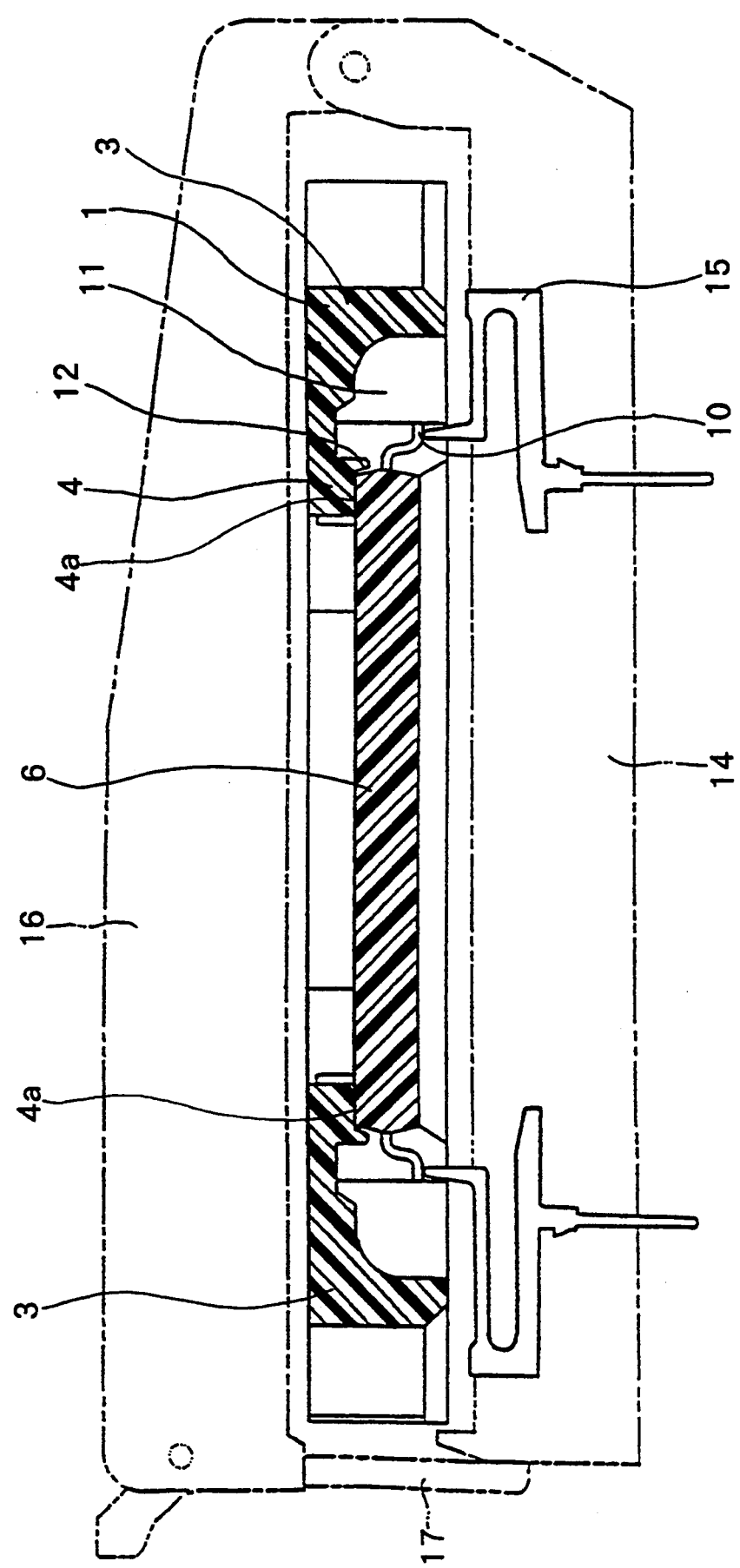
FIG. 5 is a sectional view taken on line V—V of FIG. 4.

As shown in FIGS. 1 to 5, the IC support portions 4 are formed of plates which project toward the IC receiving portion 2 from central portions of at least a pair of selected opposite sides of the frame 3. The projecting plates, namely, the pair of IC support portions 4, support the lower surfaces of central portions of two corresponding opposite sides of an IC package body 6 as shown in FIG. 5 to provide a two-place support, when the IC package body 6 is placed on the upper surfaces of the free end portions of the IC support portions 4. Specifically, each IC support portion 4 is formed of a plate only one side of which is connected to and supported by the frame 3 and the remaining three sides of which are not connected to or supported by the frame 3 (i.e., in a cantilevered fashion). An IC loading portion 4a is formed at the free end of the IC support portion 4.

That is, when received in the IC receiving portion 2, the IC package is supported on the various above-mentioned parts of the IC support portions 4 and, therefore, is prevented from escaping downwardly of the IC carrier 1.

Figure 7:
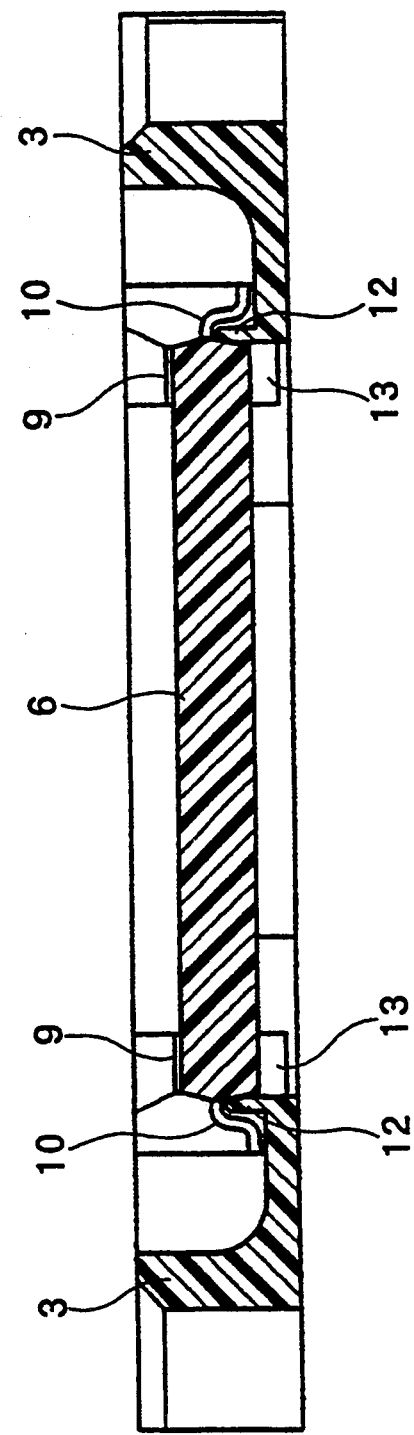
FIG. 7 is a sectional view showing the IC carrier with an IC package held thereon.

Preferably, a positioning rib 12 projecting from an upper surface of each supporting portion 4 along the corresponding side surface of the IC package body 6 is provided in order to regulate locate the side surface. As shown in FIGS. 5 and 7, the IC package body 6 having the shape of a flat square is provided with a plurality of leads 10 projecting sideward from each side thereof. These leads 10, as illustrated, extend diagonally downwardly from the upper surface of the IC package body 6 and are at lower ends thereof generally horizontally to be formed in the shape of crab feet.

On the other hand, the latch arms 5 are disposed at opposite sides of the IC support portions 4. One end (basal end) of each latch arm 5 is connected to the frame 3. The other end (distal end) of the latch arm 5 extends toward a corresponding corner portion of the IC package body 6 received in the IC receiving portion 2 so as to elastically engage an upper surface of the corresponding corner portion of the IC package body 6.

The distal end of the latch arm 5 is defined as a corner regulation portion 7. This corner regulation portion 7 includes a pair of regulation elements 8a and 8b which extend along side surfaces of the IC package body 6 to form the corner portion and in the shape of the letter Y. The corner regulation portions 7 regulate the IC package with the regulation elements 8a and 8b, so as to correctly position the IC package. An engagement claw 9 is formed on either of the regulation elements 8a and 8b of each corner regulation portion 7. This engagement claw 9 includes a downwardly facing IC package engaging face, and is operated to engage an upper edge of the corresponding corner portion of the IC package body 6 in order to prevent the IC package from escaping upwardly of the IC carrier. Preferably, the engagement claw 9 is formed on an inner surface of the outer regulation element 8a.

As shown in FIG. 4, the latch arms 5 can be elastically displaced between engagement positions (or positioning positions), shown by solid lines, and engagement-released positions, shown by broken lines, respectively. Specifically, the latch arms 5 can be elastically outwardly displaced to the engagement-released position and inwardly displaced to the engagement position. By outwardly displacing the latch arms 5 to the engagement-released position against the elasticity thereof using an appropriate tool, the latch arms 5 are disengaged from the IC package body 6 so that the IC package can be unloaded and loaded. Upon removal of the sideward pressure imposed by the tool, the latch arms 5 are elastically inwardly restored to their initial positions, so that the side surfaces of the corner portions of the IC package may be correctly regulated by the respective regulation elements 8a and 8b and at the same time, the engagement claws 9 are brought into engagement with the upper edges of the corner portions.

More specifically, the latch arms 5 are elastically horizontally displaced, i.e., inwardly and outwardly displaced (pivoted) in a plane parallel to the upper and lower surfaces of the frame 3 forming the IC carrier 1 (in a plane parallel to the upper and lower surfaces of the IC package), with the connection portions between the latch arms 5 and the frame 3 serving as fulcrums, so that the latch arms 5 may be engaged with and disengaged from the IC package body 6. The latch arms 5 are so designed to not emerge outside from the upper and lower surfaces of the frame 3 forming the IC carrier 1, and are horizontally pivoted within the thickness of the frame 3.

Loose-insertion spaces 11 are formed at an outer area of the IC receiving portion 2 so that the IC leads 10 may be enclosed therein in non-contacting condition relative to the IC carrier 1.

The spaces 11 are formed between the adjacent latch arms 5, respectively. The upper and lower surfaces, the opposite side surfaces, and the foremost end face of each IC lead 10 are fully enclosed in the lead loose-insertion space 11 in free conditions. In other words, all parts of the upper and lower surfaces, the opposite side surfaces, and the foremost end face of each IC lead 10 are fully enclosed in the insertion space 11 in non-contacting conditions relative to the corresponding wall surface which defines the space 11.

The latch arm 5 is laid along the corresponding side of the IC carrier or extended inwardly from the corresponding side part of the frame 3. It may be arranged such that each latch arm 5 extends inwardly from the corresponding corner portion of the IC carrier (i.e., corresponding corner portion of the frame 3). By disposing the latch arm 5 obliquely toward the corresponding corner portion of the IC receiving portion from a position remote from the corresponding corner portion of the IC carrier 1, the horizontal pivotal movement of the latch arm 5 can be effectively performed.

Aside from the use for transfer and storage, the IC carrier 1 holding the IC package is used as a means for contacting an IC socket 14 as shown in FIG. 5. That is, as one use, the IC carrier 1 carrying thereon the IC package can be loaded on the socket 14. Once the IC carrier 1 carrying thereon the IC package has been loaded on the socket 14, the IC leads 10 come into contact with corresponding contacts 15 of which the socket 14. Upon depression of the IC carrier with a presser means such as a presser cover 16 pivotally mounted on the socket 14, the leads 10 are forced to contact the corresponding contacts 16. This pressure-contacting condition is maintained by the engagement of a lock lever 17, attached to one end of the cover 16, with the socket 14.

In another form of a contacting condition, it may be arranged such that by utilizing the receiving form of the IC leads 10, the foremost end portions of the contacts are disposed between the leads 10 and the carrier 1 so that the contacts may come into contact with the IC carrier 1.

Figure 8:
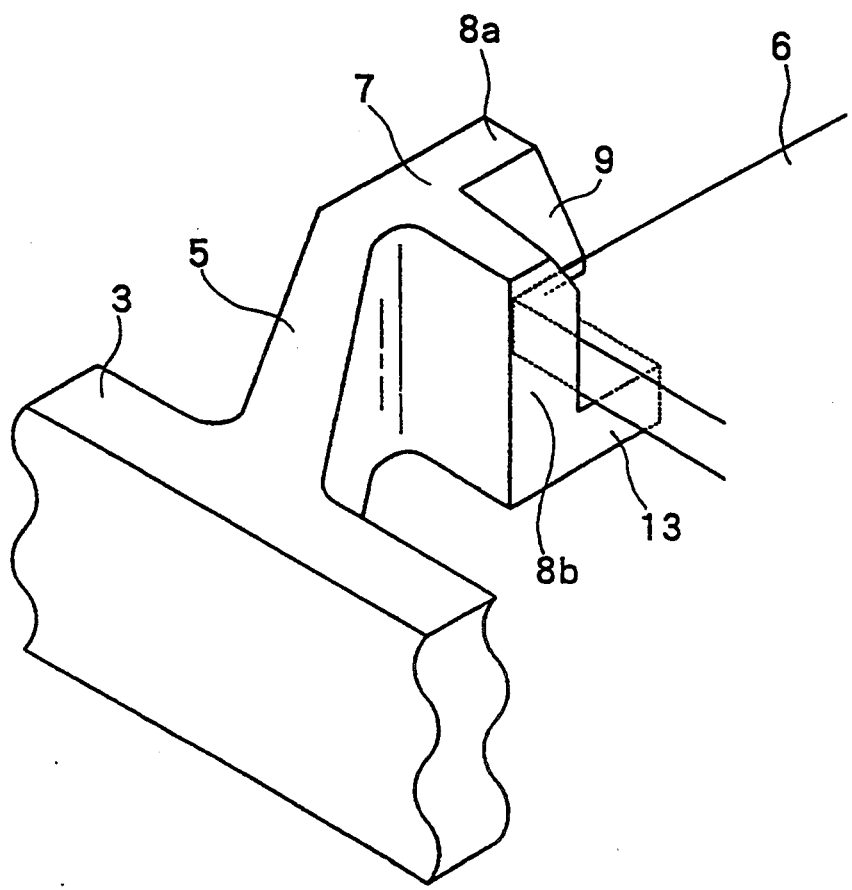
FIG. 8 is a perspective view showing an important portion of a latch arm of FIG. 6.

Another embodiment of the present invention will be described with reference to FIGS. 6 to 8.

In this embodiment, the latch arm 5 forms a retainer portion for prohibiting the IC package from escaping upwardly and downwardly of the IC package 1. As in the preceding embodiment, the latch arm 5 extends toward the corresponding corner portion of the IC receiving portion 2 from the frame 3 and has engagement claws 9 and 13 projecting from the foremost end portion thereof and adapted to engage the upper and lower edges of the corresponding corner portion of the IC package body 6 (i.e. the claw 9 includes a downwardly facing IC package engaging face and the claw 13 includes an upwardly facing IC package engaging face). The IC package body 6 once carried on the IC carrier 1 is prohibited from escaping upwardly and downwardly therefrom by the engagement claws 9 and 13

More particularly, as in the preceding embodiment, the latch arm 5 is provided at its foremost end with a generally Y-shaped corner regulation portion 7 for regulating the side surface of the corresponding corner portion of the IC package body 6. A selected one 8a of the regulation elements (regulation element which is outwardly displaced) is provided with the engagement claw 9 projecting from its inner surface and adapted to engage the upper edge of the corresponding corner portion of the IC package body 6. The other regulation element 8b is provided with the engagement claw 13 projecting from its inner surface and adapted to engage the lower edge of the corner portion of the IC package body 6. As shown in FIGS. 7 and 8, the corresponding corner portion of the IC package body 6 is brought into engagement with the inner sides of the regulation elements 8a and 8b so as to be correctly positioned, and the engagement claws 9 and 13 are brought into engagement with the upper and lower edges of the corresponding corner portion so that the IC package may be correctly received in the IC receiving portion 2.

Also in this embodiment, the loose-insertion spaces 11 for enclosing therein the IC leads 10 in non-contacting conditions relative to the IC carrier 1 are formed at the outer area of the IC receiving portion 2.

The lead loose-insertion spaces 11 are formed between the adjacent latch arms 5, and the upper and lower surfaces, the lengthwise opposite side surfaces, and the end faces of the IC leads are fully enclosed in the spaces 11 in free conditions.

In the case where the IC package body 6 is held by the engagement claws 9 and 13 formed on the latch arms 5 as above described and as shown in FIGS. 6 and 7, the loading portions 4a for supporting the lower surface of the IC package body 6 are not provided on the supporting portions 4 and only positioning ribs 12 are provided thereon to regulate the side surfaces of the IC package body 6.

Figure 2:
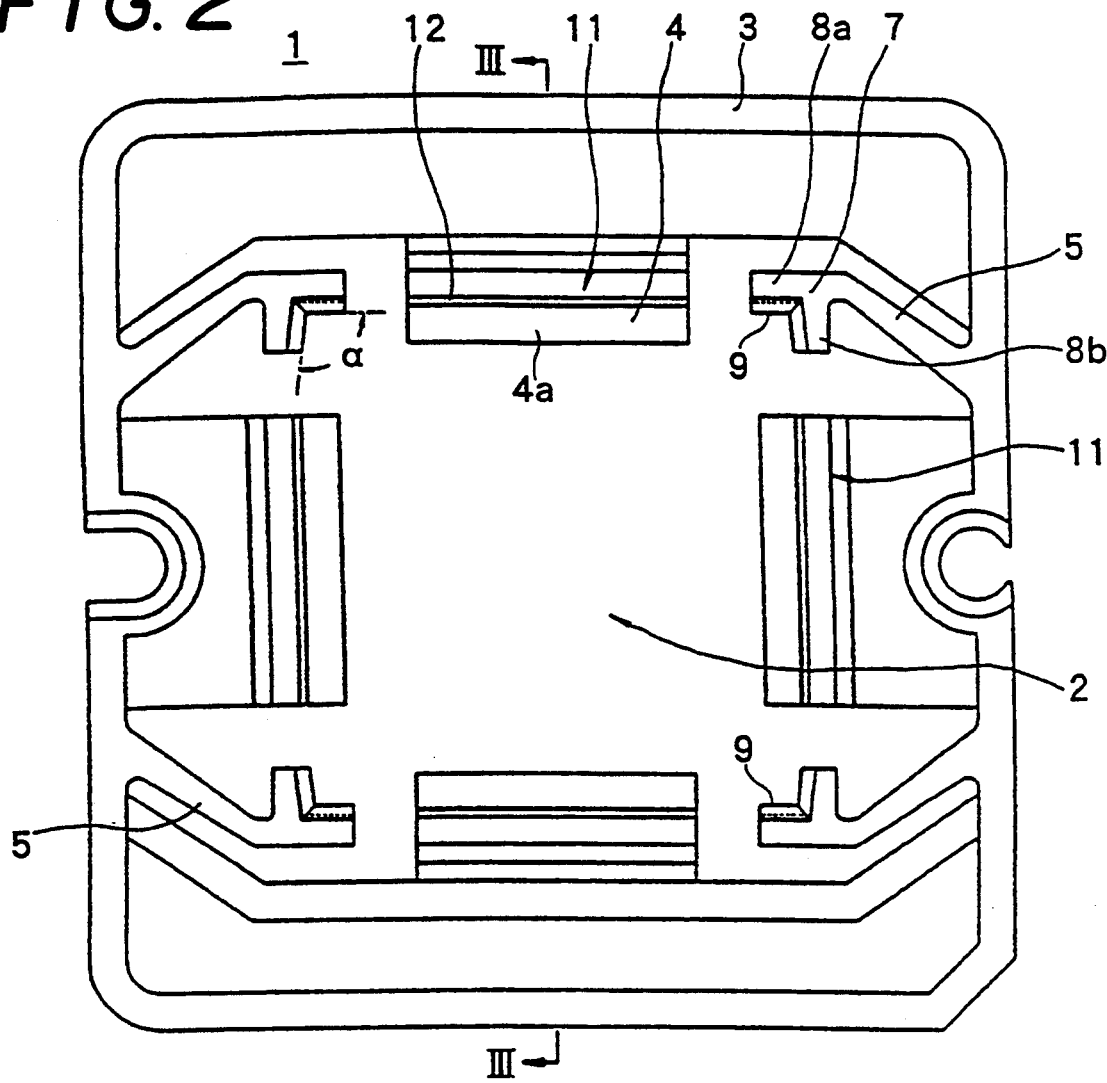
FIG. 2 is a plan view of the FIG. 1 embodiment
Figure 3:
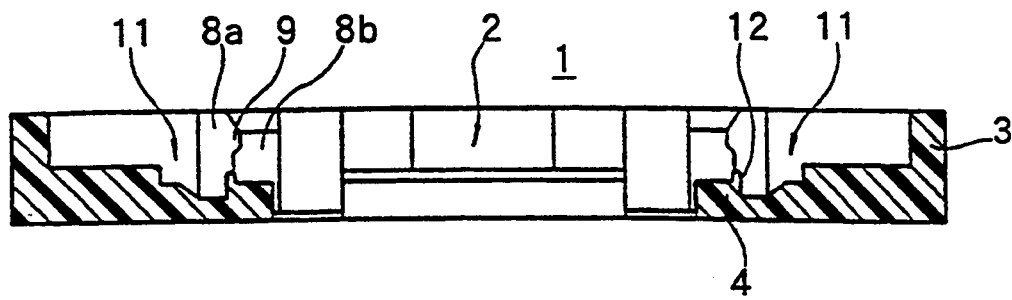
FIG. 3 is a sectional view taken on line III—III of FIG. 2.

As shown in FIG. 2, an angle between the regulation elements 8a and 8b forming the corner regulation portion 7 is a right angle which corresponds to the angle of the corresponding corner portion of IC package body 6. It may also be designed such that the angle α is slightly larger than the right angle so that corresponding corner portion of the IC package body 6 may be regulated by the part in the vicinity of the crossing point of the angle 8a and 8b G. As another alternative, the regulation element 8b shown in FIG. 6 can be formed longer than the other regulation element 8a, and the longer regulation element 8b being provided with the engagement claw 13 for supporting the lower edge of the corresponding corner portion of the IC package body 6 and the shorter regulation element 8a is provided with the engagement claw 9 for engaging the upper edge of the corresponding corner portion of the IC package body 6. In this manner the engagement claw 9 may be easily disengaged when the latch arm 5 is displaced outwardly and the engagement claw 3 may keep supporting the IC package body 6. This relation can be established either by making different the engaging position between the engagement claws 9 and 13, or making different the displacement amount between the engagement claws 9 and 13 when the latch arm 15 is elastically displaced.

As described in the foregoing, according to the present invention, without depending on the means for inserting the leads into a slot or disposing a positioning element between the adjacent leads as in the prior art, the IC package is properly held on the IC carrier by the latch arms and in that condition, the side surfaces of the corner portions of the IC package body are properly regulated by the corner regulation portions formed on the foremost ends of the latch arms so as to be correctly positioned.

That is, according to this invention, the corner portions of the IC package body are received between the regulation elements of the corner regulation portions formed on the latch arms, and the corner portions are regulated by the regulation elements so that the IC package may be correctly positioned. At the same time, the engagement claws formed on the regulation portions are brought into engagement with the upper edges of the corner portions so that IC package may be positively received in the receiving portion. Moreover, the leads can be effectively prevented from being deformed when the leads are regulated, and the very small pitch arrangement of the IC leads can be properly coped with.

What is claimed is:

1. An IC carrier comprising an IC receiving portion for receiving therein an IC package, and a latch arm for engaging an edge portion of said IC package received in said IC receiving portion so that said IC package may be anchored in said receiving portion, said IC carrier further comprising a corner regulation portion formed on a foremost end portion of said latch arm and having a regulation element disposed along one side surface of a corner portion of an IC package body and a regulation element disposed along the other side surface thereof, said corner regulation portion being provided with an engagement claw for engaging an upper edge of the corner portion of the IC package body.

2. An IC carrier according to claim 1, in which said corner regulation portion of said latch arm further includes a supporting portion for supporting a lower edge of the corner portion of said IC package body.

3. An IC carrier according to claim 1, in which said latch arm is elastically displaceable in a plane parallel to an upper surface of said IC package body so as to engage and disengage from the IC package body.

4. An IC carrier comprising:
 a frame having an IC receiving portion defined therein;
 at least one latch arm fixed to said frame and extending inwardly therefrom toward said IC receiving portion; and
 a corner regulation portion formed on a foremost end of said at least one latch arm, said corner regulation portion including a first regulation element extending away from said latch arm in a first direction, a second regulation element extending away from said latch arm in a second direction different than said first direction such that a corner is formed between said first and second regulation elements, and a engagement claw disposed between said first and second regulation elements and having a downwardly facing IC package engaging face.

5. An IC carrier as recited in claim 4, wherein said corner regulation portion further includes an IC package supporting portion disposed between said first and second regulation elements and having an upwardly facing IC package engaging face.

6. An IC carrier as recited in claim 4, wherein said at least one latch arm comprises at least one elastically laterally-flexible latch arm.

7. An IC carrier as recited in claim 4, wherein said IC receiving portion has four corners; and said at least one latch arm comprises four latch arms, each of which extends inwardly from said frame and toward said IC receiving portion substantially at said four corners, respectively.

* * * * *